United States Patent [19]

Mattson et al.

[11] Patent Number: 4,542,295
[45] Date of Patent: Sep. 17, 1985

[54] SPECTROMETER WITH SELECTABLE AREA DETECTOR

[76] Inventors: David R. Mattson, 3222 Patty La., Middleton, Wis. 53562; Patrick J. Coffey, 301 Oldfield Rd., Madison, Wis. 53717

[21] Appl. No.: 537,111

[22] Filed: Sep. 29, 1983

[51] Int. Cl.$^4$ .................... H01L 27/06; G01J 5/20
[52] U.S. Cl. ........................ 250/352; 250/338; 250/349; 250/358.1; 250/370
[58] Field of Search ............ 250/338 SE, 338 R, 349, 250/350, 351, 352, 370 JX, 370 K, 370 R, 370 H, 370 G, 358.1, 372, 394; 357/29; 356/222, 346; 378/116

[56] References Cited

U.S. PATENT DOCUMENTS

| | | | |
|---|---|---|---|
| 3,415,994 | 12/1968 | Fitti, Jr. | 250/349 |
| 3,666,359 | 5/1972 | Lee | 350/162.13 |
| 3,742,239 | 6/1973 | Gale | 250/349 |
| 4,213,137 | 7/1980 | Pines | 357/30 |

OTHER PUBLICATIONS

J. Gast and L. Genzel, "An Amplitude Fourier Spectrometer for Infrared Solid State Spectroscopy", *Optics Communications,* vol. 8, No. 1, (May 1973), pp. 26–30.

*Primary Examiner*—Alfred E. Smith
*Assistant Examiner*—Constantine Hannaher
*Attorney, Agent, or Firm*—Thomas C. O'Konski

[57] ABSTRACT

A Fourier transform infrared spectrometer utilizes a selectable area infrared detector to optimize performance of the instrument depending upon the nature of the sample being analyzed. The detector includes an inner detecting segment and one or more outer detecting segments which extend at least partially around the inner segment and are electrically isolated therefrom. In those cases where a small area detector provides optimal sensitivity and performance, only the inner detecting segment is enabled to contribute to the output of the detector. In those cases where a larger area detector provides optimal sensitivity and performance, one or more of the outer detecting segments are enabled to contribute to the output of the detector, either alone or in combination with the inner segment. Thus, a single detector in the instrument provides optimal sensitivity and performance for a wide range of applications.

20 Claims, 5 Drawing Figures

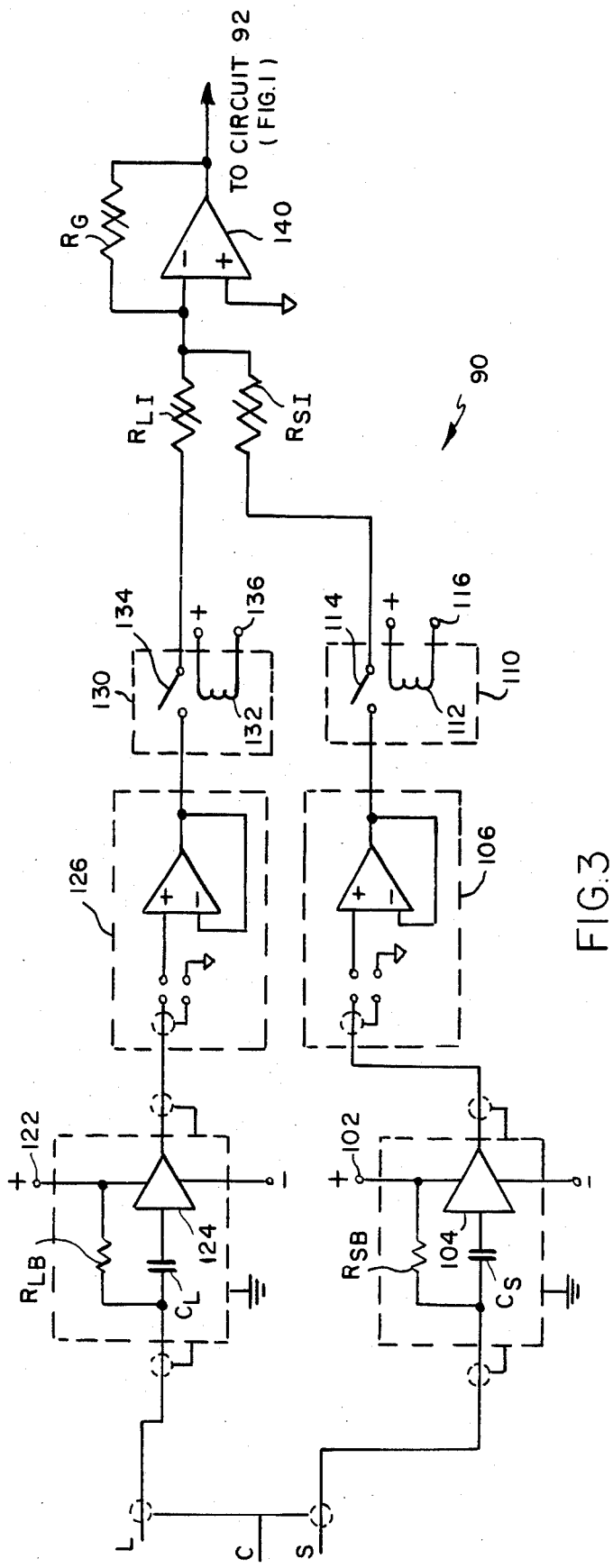
FIG. 3
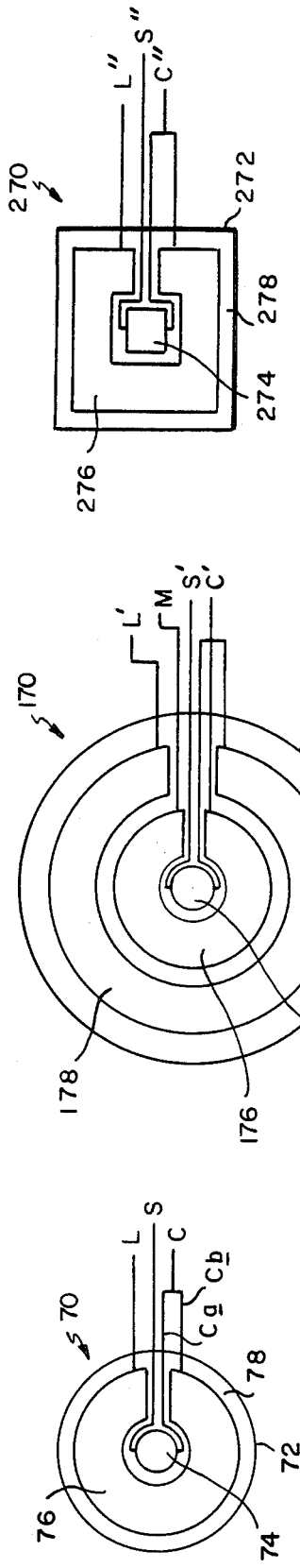
FIG. 5
FIG. 4
FIG. 2

SPECTROMETER WITH SELECTABLE AREA DETECTOR

BACKGROUND OF THE INVENTION

1. Field of the Invention

This invention relates generally to spectroscopy and, more particularly, to an improved Fourier transform infrared spectrometer utilizing a detector having an infrared active area that can be controllably varied in size to optimize performance of the spectrometer for any of a variety of applications.

2. Discussion of the Prior Art

Fourier transform infrared (FT-IR) spectrometers are widely used in the analysis of chemical compounds. By measuring the absorption of infrared radiation by an unknown sample at various wavelengths in the infrared spectrum, and comparing the results with known standards, these instruments permit considerable useful information with respect to the chemical make-up of the unknown sample to be obtained. For an excellent discussion of these instruments, their theory of operation, design, and various applications, reference is made to the book titled *Chemical Infrared Fourier Transform Spectroscopy*, by Peter R. Griffiths, published by John Wiley & Sons (1975).

In a typical FT-IR spectrometer, infrared radiation from an infrared emitting source is collected, passed through an interferometer, passed through the sample to be analyzed, and finally brought to focus on an infrared detector. The interferometer system, in combination with the sample, modulates the intensity of the infrared radiation that impinges on the detector, and thereby forms a time variant intensity signal. It is the function of the detector to convert this time variant intensity signal to a corresponding time varying current. The current, in turn, is converted to a time varying voltage, which is presented to an analog-to-digital converter, and then stored as a sequence of digital numbers to be processed in a processor associated with the spectrometer.

Since the amount of infrared energy that impinges on the detector in an FT-IR spectrometer is usually very small, the detector must have a relatively high sensitivity and signal-to-noise ratio. While room temperature thermal detectors may be used for some spectrometer applications, many other applications require a much greater sensitivity than that which can be provided by room temperature detectors. In such higher sensitivity applications, cryogenically cooled semiconductor photon detectors, such as those fabricated from mercury cadmium telluride (MCT), are commonly used. MCT detectors are typically cooled with liquid nitrogen to a temperature of about 77 degrees Kelvin. This is accomplished by mounting the MCT detector on the end of a "cold finger" positioned within a vacuum-sealed dewar. The cold finger is in thermal contact with a liquid nitrogen reservoir. The infrared radiation to be detected passes to the MCT detector through an infrared transmissive window in the dewar housing. Since MCT provides excellent response to infrared radiation when cooled to the liquid nitrogen temperature, the sensitivity of such detectors is greatly improved when compared with room temperature detectors.

MCT detectors follow traditional detection sensitivity theory. More specifically, the MCT detector contributes noise to its output signal in direct proportion to the square root of the active area of the detector. At the same time, the detector converts incident infrared intensity signals into currents in direct proportion to the active area of the detector. Thus, the sensitivity of the detector, as measured by the signal-to-noise ratio of its output signal, increases in proportion to the square root of the detector active area. This sensitivity is an important parameter to the performance of general purpose FT-IR spectrometers. Its importance is best illustrated by considering the following three experiments common to the application of such spectrometers.

A. Analysis of large, clear samples

In the case where the sample being analyzed in the spectrometer is relatively large and relatively clear, the intensity of the infrared signal that impinges on the MCT detector is relatively high, and has a tendency to saturate the detector. Saturation occurs when the intensity of the signals incident on the detector is so high that the signals overwhelm the ability of the detector to convert photons into elements of current. Saturation, in turn, produces nonlinearity in the output of the detector, which degrades the accuracy of the spectrometer measurements. Thus, in the case of large, clear samples, an MCT detector with a relatively small active area is more desirable than a similar detector with a larger active area.

B. Analysis of large, opaque samples

In the case where the sample being analyzed is relatively large but nearly opaque, the intensity of the infrared signal that impinges of the MCT detector is very low, requiring maximum sensitivity from the detector. However, in this case, the physical size of the image of the infrared signal that is projected onto the detector is relatively large, typically on the order of three millimeters in diameter. The projected image remains this size and cannot generally be reduced at the detector focal plane due to practical limitations on the focusing ability of the reflecting optics in the spectrometer. Thus, in the case of large, opaque samples, it is desirable to employ an MCT detector with a relatively large active area, in order to maximize the infrared energy collected by the detector and the resulting signal-to-noise ratio of its output signal.

C. Analysis of small samples

In the case where the sample being analyzed is relatively small, the physical size of the image of the infrared signal that is projected onto the detector is also relatively small, typically on the order of one millimeter or less in diameter. The small size of the projected image results directly from geometrical and optical considerations involved in imaging the small sample from the focal plane of the sample to the focal plane of the detector. In this case, optimum sensitivity is achieved by matching the active area of the MCT detector to the physical size of the spectrometer's projected image. If the detector has an active area that is larger than the projected image, sensitivity decreases, since the outer portions of the detector, while contributing noise, are not being utilized to collect infrared energy.

Accordingly, it can be seen that, depending upon the particular application of the FT-IR spectrometer, the nature of the sample being analyzed, and other such factors, optimal performance is obtained by use of either a small or a large area MCT detector. However, these detectors, together with their associated dewar, cooler, optical and electronic components, are quite expensive, very often one of the most expensive parts of the entire spectrometer system. They are also rather difficult to position precisely at the proper focus of the spectrometer. Moreover, proper utilization of either a small or a large detector in an FT-IR spectrometer involves several other changes to the optics and electronics of the spectrometer, which makes the substitution of one detector for another rather difficult and time consuming. These overall considerations have typically prompted spectrometer vendors to supply only one or the other of these detectors (large or small area, but not both) with their instruments, depending upon the end user's particular application. Those end users desiring to use a single spectrometer for a variety of different applications have been compelled either to settle for less than optimal performance in some applications, or to bear the added expense and inconvenience of possessing and substituting multiple detectors.

There thus exists a need in the art for a spectrometer which can provide optimal performance in any of a variety of applications without the requirement for more than one detector.

SUMMARY OF THE INVENTION

In accordance with the present invention, apparatus for analyzing a sample by interacting a beam of radiant energy with the sample is provided with a radiant energy detector, the effective active area of which can be selected depending upon the nature of the sample being analyzed and upon the particular experiment being performed. The detector includes an inner detecting segment and one or more outer detecting segments which extend at least partially around the inner segment and are electrically isolated therefrom. In those cases where a small area detector provides optimal sensitivity and performance, only the inner detecting segment is enabled to contribute to the output of the detector. In those cases where a larger area detector provides optimal sensitivity and performance, one or more of the outer detecting segments are enabled to contribute to the output of the detector, either by themselves or in combination with the inner segment. As a result, the effective active area of the detector is selectable, and a single detector in the apparatus provides optimal sensitivity and performance for any of a wide variety of samples and experiments.

In the preferred embodiment of the invention which is described in detail below, the apparatus for analyzing the sample comprises a Fourier transform infrared interferometer spectrometer. The detecting segments of the detector used in the spectrometer are fabricated from an infrared responsive semiconductor material, such as mercury cadmium telluride, and are cryogenically cooled to optimize their sensitivity and performance. Circuit means are used to determine which of the detecting segments is allowed to contribute to the detector output, thereby permitting selection of the effective detector active area for each given experiment.

BRIEF DESCRIPTION OF THE DRAWINGS

The foregoing and other objects, features and advantages of the invention will be better understood by reference to the following detailed description taken in conjunction with the accompanying drawing in which:

FIG. 2 illustrates further details of a selectable area infrared detector element of the type which may be utilized in the spectrometer of FIG. 1;

FIG. 3 is a schematic diagram showing further details of a pre-amplifier and detector area select circuit used in the spectrometer of FIG. 1;

FIG. 4 illustrates details of another selectable area infrared detector element of the type which may be utilized in the spectrometer of FIG. 1; and FIG. 5 illustrates details of still another selectable area infrared detector element of the type which may be utilized in the spectrometer of FIG. 1.

DESCRIPTION OF THE PREFERRED EMBODIMENTS

Figure 1:
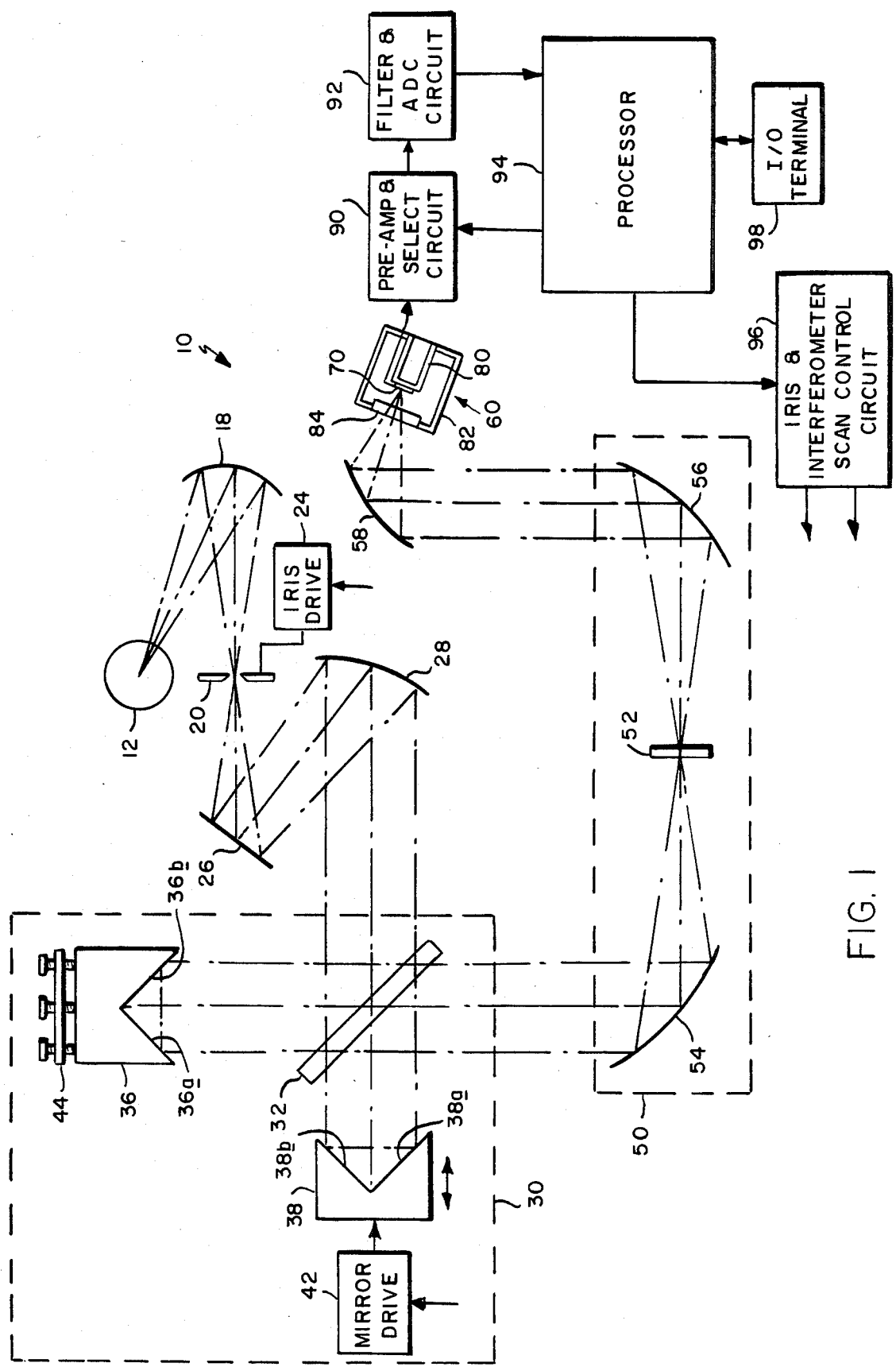
FIG. 1 is a partially schematic, partially block diagrammatic illustration of an FT-IR spectrometer embodied in accordance with the invention.

Referring now specifically to the drawing, and initially to FIG. 1 thereof, there is shown an FT-IR spectrometer 10 embodied in accordance with the present invention. The spectrometer 10 includes a source 12 of infrared radiation. Illustratively, the source 12 comprises a water-cooled carbide glower element of conventional design which emits broadband radiation in the infrared region of the electromagnetic spectrum.

The radiation emitted by the source 12 is collected by an effective focal length (EFL) mirror 18 which reflects and focuses the radiation to a spot in the plane of an iris 20. The diameter of the aperture of the iris 20 is variable under the control of an iris drive 24 to control the beam size of the infrared radiation that passes through the remaining components of the spectrometer 10.

The radiation passing through the aperture of iris 20 is reflected by a flat mirror 26 onto another EFL mirror 28. The mirror 28 collimates the radiation and directs it to an interferometer 30 which serves to vary, or scan, the intensity of the radiation in a controlled fashion.

While various different types of interferometers may be used in the spectrometer 10, the interferometer 30 in the particular embodiment being described is illustratively a 90° Michelson interferometer. The radiation that enters interferometer 30 is incident upon a beamsplitter 32. The beamsplitter 32 reflects approximately 50 percent of the incoming infrared energy along a first direction (i.e., upwardly in the plane of FIG. 1), and transmits approximately the other 50 percent of the incoming infrared energy along a second direction (i.e., to the left in the plane of FIG. 1) that is displaced 90° from the first direction. The incoming infrared radiation is thus split by the beamsplitter 32 into two, substantially equal energy beams which propagate at 90° to one another. Illustratively, the beamsplitter 32 may comprise a polished potassium bromine (KBr) substrate which is tilted 45° relative to the plane normal to the path of travel of the incoming infrared radiation. As is well known, the KBr substrate is typically provided with a multi-layer coating optimized to provide the desired reflectance and transmission for the particular infrared wavelength spectrum emitted by the source 12.

The two beams split by the beamsplitter 32 are reflected rearwardly back towards the beamsplitter 32 by corner reflectors 36 and 38, respectively. While flat mirrors could be used in the interferometer 30 for this purpose, corner cube reflectors 36 and 38 of the type illustrated in FIG. 1 are preferred. Such corner cube reflectors 36 and 38, which include reflecting surfaces 36a, 36b and 38a, 38b, respectively, disposed at 90° to one another, reflect each ray of radiant energy incident thereon rearwardly along a path that is exactly parallel to that of the incident ray regardless of any tilt of the reflectors off normal. The corner cube reflectors 36 and 38 thus eliminate interferometer baseline drift, and insure that none of the infrared energy that is input to the interferometer 30 is lost, due to mirror tilt or imperfect alignment.

The beamsplitter 32 is such that it transmits the beam returning from corner cube reflector 36, reflects the beam returning from corner cube reflector 38, and thus spatially recombines the two beams into a composite, interfering beam that exits the interferometer 30 along a direction displaced 90° from that of the incoming radiation (i.e., downwardly in the plane of FIG. 1). The intensity of the output beam from the interferometer 30 is scanned in a conventional manner by varying the distance of one of its corner reflectors from the beamsplitter 32. In the interferometer 30 shown in FIG. 1, the corner cube reflector 36 is fixed in respect to its distance from the beamsplitter 32, while the corner cube reflector 38 is movable toward and away from the beamsplitter 32 under the control of a mirror drive 42 to effect the desired intensity scanning. As is also conventional, the fixed reflector 36 is provided with a set of micrometer screw adjustments 44 which are used to insure that the reflectors 36 and 38 are disposed exactly orthogonal to one another for proper interferometer operation.

Those desiring further details of Michelson interferometers, and of other types of interferometers useful in the spectrometer 10, are referred to the book titled *Concepts of Classical Optics*, by John Strong, published by W. H. Freeman & Company (1958), particularly Chapter XI, pages 222–245 thereof.

The beam from the interferometer 30 next enters a sample compartment 50 of the spectrometer 10 where a sample 52 to be analyzed is mounted. The interferometer beam is collected and focused by an EFL mirror 54 located in the compartment 50 to a spot in the focal plane of the sample 52. The infrared radiation thus incident on the sample 52 is selectively absorbed, reflected or transmitted by the sample during each scan of the interferometer 30, depending upon the particular chemical make-up of the sample 52. The resulting time-varying intensity-modulated radiation signal emerging from the sample 52 is collected and collimated by a second EFL mirror 56, which directs the radiation signal out of the compartment 50 for detection and processing.

Specifically, the intensity modulated radiation signal emerging from the sample compartment 50 is collected and focused by EFL mirror 58 to a spot in the focal plane of infrared detector 60. The infrared detector 60 converts the intensity-modulated radiation signal to a corresponding time-varying current signal. In the preferred embodiment of the invention being described, the detector 60 comprises a cryogenically cooled photon detector having a selectable area detector element 70 fabricated from an infrared sensitive semiconductor, such as mercury cadmium telluride (MCT). As shown in FIG. 1, the detector element 70 is mounted on the end of a cold finger 80 located inside a vacuum-sealed dewar 82. The radiation signal from the sample compartment 50 passes to the detector element 70 through an infrared transmissive window 84 mounted in the dewar 82. The detector element 70 is cooled to approximately 77° Kelvin (i.e., the temperature of liquid nitrogen at atmospheric pressure) by flowing liquid nitrogen through the interior of the cold finger 80. The detector element 70 will be described in further detail below in connection with FIG. 2. Suffice it to say for present purposes that, in accordance with the invention, the size of the active area of the detector element 70 is selectable through suitable control to optimize performance of the spectrometer 10 depending upon the nature, size and geometry of the sample 52 being analyzed and the particular experiment or analysis being performed.

Still referring to FIG. 1, the time-varying current signal output from the detector 60 is applied to a preamplifier and detector area select circuit 90. As its name implies, the circuit 90 provides initial gain to the current signal from the detector 60, and is used in the selection of the active area of the detector element 70, in a manner described more fully below in connection with FIG. 3. The detector current signal is then presented to an electronic filter and analog-to-digital converter (ADC) circuit 92. The circuit 92 eliminates noise components from the signal whose frequencies are either higher or lower than the frequency band of the desired signal components, and converts the signal to a digital format compatible with a processor 94. The processor 94, in turn, performs signal averaging, Fourier transform and standard comparison functions in a well known manner, not essential to an understanding of the present invention. The processor 94 may also be used to control automatically the sampling and data collection functions of the spectrometer 10 in accordance with predetermined, stored programs. In this respect, command signals from the processor 94 may be coupled to an iris and interferometer scan control circuit 96. In response to processor command signals, the circuit 96 controls the iris drive 24 to set or vary the aperture of iris 20, and the mirror drive 42 to set or vary the interferometer scan velocity, depending upon the particular sampling cycle and experiment being run. User input to, and output from, the processor 94 are provided via I/O terminal 98.

Those desiring further information concerning the signal averaging, Fourier transform, standard comparison and control functions performed by a typical FT-IR spectrometer processor are referred to the previously cited book titled *Chemical Infrared Fourier Transform Spectroscopy* by P. R. Griffiths.

Referring now to FIG. 2 of the drawing, there are shown further details of the selectable area detector element 70 used in the embodiment of FIG. 1. The element 70 comprises an electrically insulative substrate 72, having a circular wafer-like configuration and a substantially smooth and flat major face 78. Mounted on the face 78 of the substrate 72 is a pair of MCT infrared detecting segments 74 and 76. The inner detecting segment 74 has a circular shape. The outer detecting segment 76 has more or less the shape and configuration of a letter "C". The outer segment 76 is positioned concentrically about, but spaced somewhat from, the inner segment 74. Due to the spacing between the segments 74 and 76, they are electrically isolated from one another.

Electrical connection is provided to the detecting segments 74 and 76 by leads L, S and C. The lead S electrically connects to one side of the inner segment 74. It is deposited on the face 78 of the substrate 72 in the space between the segments 74 and 76, and extends outwardly from the inner segment 74 through the small opening or spacing on the right side of the C-shaped outer segment 76. The lead L electrically connects to one side of the outer segment 76. The common lead C, which includes a pair of branches Ca and Cb that converge, electrically connects to the opposite sides of the inner and outer segments 74 and 76, respectively. The substrate 72 is mounted, face 78 up, on the end or tip of cold finger 80 (FIG. 1). Since, as noted earlier, the cold finger 80 is positioned within the interior space of the dewar 82, the leads L, S and C are fed through the dewar wall for external electrical connection in the preamplifier and detector area select circuit 90 of FIG. 1.

In a specific illustrative example of the detector element 70, the inner segment 74 has a diameter of about one millimeter, while the outer segment 76 has an outer boundary diameter of about three millimeters. The spacing between the segments 74 and 76 is made as small as possible, while still providing the desired electrical isolation between the segments 74 and 76, and sufficient space for the deposition of the leads S and Ca.

By enabling only the inner detecting segment 74 to contribute to the output of the detector element 70, the element 70 operates effectively as a small area detector having a circular active area of diameter equal to that of the inner segment 74. By enabling both the inner and outer detecting segments 74 and 76 to contribute to the output together, and by summing the respective output signals generated thereby in response to the incident radiation signal, the detector element 70 operates effectively as a large area detector having a circular active area of diameter equal to that of the outer boundary of the outer segment 76. Thus, optimal performance may be achieved with the spectrometer 10 through appropriate control of the selectable area detector element 70 regardless of the nature, size and geometry of the sample 52 being analyzed.

FIG. 3 illustrates further details of the pre-amplifier and detector area select circuit 90 of FIG. 1. As shown in FIG. 3, the three leads L, S and C extending from the detector element 70 of FIG. 2 are fed to the circuit 90. As noted earlier, the lead C is a common electrical connection for the two detecting segments 74 and 76. In the circuit 90, the lead C is connected to signal and system ground.

Bias is applied to the inner detecting segment 74 through resistor $R_{SB}$. DC bias current flows from a positive DC power supply terminal 102, through resistor $R_{SB}$, through lead S, through the inner detecting segment 74 of detector element 70 (FIG. 2), and finally to system ground via common lead C. When bias current is flowing, the inner detecting segment 74 is enabled. An intensity modulated infrared radiation signal which impinges on the segment 74 will thus be converted thereby to a corresponding, time-varying current signal on the lead S.

In the circuit 90, the time-varying current signal on the lead S is AC coupled through capacitor $C_S$ to pre-amplifier 104. Pre-amplifier 104 amplifies the current signal, with a typical gain factor being 150. The output of the pre-amplifier 104 is then connected to an operational amplifier follower circuit 106 which buffers the signal and presents it to relay switch 110.

Relay switch 110 is a normally open relay switch which includes a drive coil 112, movable switch contact 114 and a relay control terminal 116. If a positive DC power supply signal is applied to the relay control terminal 116, the drive coil 112 is de-activated, and the movable switch contact 114 will remain in an open position. If, on the other hand, a negative DC power supply signal is applied to the terminal 116, the drive coil 112 is energized to move the movable switch contact 114 to a closed position. Thus, depending upon the state of the power supply signal applied to the terminal 116, the relay switch 110 may be either opened or closed to block or pass, respectively, the time-varying current signal from the inner detecting segment 74.

Bias is applied to the outer detecting segment 76 of the detector element 70 through resistor $R_{LB}$. In a manner similar to that previously described for the inner segment 74, the outer segment 76 is thus enabled by a DC bias current flowing from a positive DC power supply terminal 122. With bias current flowing, an intensity modulated infrared radiation signal which impinges on the outer segment 76 will be converted by the segment 76 to a corresponding, time-varying current signal on the lead L.

The bias current for the outer detecting segment 76 will typically be different from that required for the inner segment 74 due to the larger area of the former. The respective values of resistors $R_{SB}$ and $R_{LB}$ may thus be selected independently of each other for proper signal operation of the two segments 74 and 76.

The time-varying current signal on the lead L is AC coupled through capacitor $C_L$ to pre-amplifier 124, which, like pre-amplifier 104, provides a typical gain of 150. This gain, however, may be selected independently of that provided by pre-amplifier 104 to provide a proper signal balance for the two detecting segments 74 and 76.

The output of the pre-amplifier 124 is then buffered by operational amplifier follower circuit 126, which, in turn, presents the current signal from the outer segment 76 to relay switch 130. Like the relay switch 110, the relay switch 130 is a normally open relay switch which includes a drive coil 132, movable switch contact 134, and relay control terminal 136. Thus, depending upon the state of the power supply signal applied to the terminal 136, the relay switch 130 may be either opened or closed to block or pass, respectively, the time-varying current from the outer detecting segment 76.

The outputs from the relay switches 110 and 130 are coupled through variable resistors $R_{SI}$ and $R_{LI}$, respectively, to summing amplifier 140. The input to the summing amplifier 140 is either the current signal from the inner detecting segment 74 only, or the current signals from both the inner and outer detecting segments 74 and 76. In the first case or mode of operation, the signal from the inner detecting segment 74 is selected exclusively by closing relay switch 110 and opening relay switch 130 via appropriate control to the terminals 116 and 136, respectively. Thus, in the first mode, the signal from the inner detecting segment 74 is received via resistor $R_{SI}$, with overall signal gain being determined by variable resistor $R_G$ connected in a feedback loop about summing amplifier 140. In the second case or mode of operation, the signals from both the inner and the outer segments 74 and 76 are selected by closing both relay switches 110 and 130 via appropriate control to terminals 116 and 136. Thus, in the second mode, the output of the summing amplifier 140 is the arithmetic sum of the signals from both the inner and outer detecting segments 74 and 76. As indicated in FIG. 3, the output of the summing amplifier 140 is coupled to the filter and ADC circuit 92 of FIG. 1.

The ratio of the values of resistors $R_{SI}$ and $R_{LI}$ establishes the summing proportions of the signals from the inner and outer detecting segments 74 and 76. The precise optimum ratio may be determined experimentally by testing for maximum signal-to-noise ratio when operating in the summing mode. In general, the variable resistors $R_{SI}$ and $R_{LI}$ provide a convenient means to balance the signals from the respective detecting segments 74 and 76 to achieve optimum performance for each application.

The decision concerning which mode of operation is more appropriate for a given sample and experiment may be made either automatically by the processor 94 under suitable software control, or manually by the operator of the spectrometer 10. In an automatic selection routine, the processor 94 may first select the first mode (inner detecting segment only), run a survey scan and analysis of the resulting signal, and then perform an analysis via a decision tree to determine whether the first mode or the second mode is more appropriate. Alternatively, the operator may direct the processor 94 to select one or the other mode of operation by entering a suitable command to the processor 94 through I/O terminal 98. In the latter case, the processor 94 does not execute the survey scan-decision tree routine, but merely couples the appropriate command signals to the relays 110 and 130 in the circuit 90 to implement the desired mode of operation.

It will be appreciated by those skilled in the art that, in some applications where a larger area detector is desired, it is sufficient if only the outer detecting segment 76 is enabled to contribute to the output of the detector element 70. In such applications, the relatively small area "dead" zone represented by a disabled inner detecting segment 74 has a negligible effect on the performance of the spectrometer 10. The decision as to whether or not the outer detecting segment can be used by itself in this respect is best made experimentally in each case. Clearly, whatever mode of operation is used, the necessary control can be effected by controlling the inputs to the relay switches 110 and 130 in the preamplifier and detector area select circuit 90 of FIG. 3.

It will also be appreciated by those skilled in the art that the relay switches 110 and 130 can be eliminated altogether from the preamplifier and detector area select circuit 90 of FIG. 3. In such a case, the detector area selection may be effected directly by controlling the bias current that flows to the detecting segments 74 and 76. For example, in the first mode of operation, when only the inner segment 74 is desired, the outer detecting segment 76 can be disabled by disconnecting the positive DC power supply voltage from the terminal 122 so that it receives no bias current. The use of the relay switches 110 and 130 to effect the segment selection is preferred, however, since it prevents transients and nonlinearities resulting from the on and off switching of the segments 74 and 76 and the other components in the circuit 90 from affecting its output.

FIG. 4 of the drawing illustrates a modified detector element 170 which may be used in lieu of the detector element 70 in the spectrometer 10 when three different active area sizes are desired. The detector element 170 of FIG. 4 includes a substrate 172 on which are mounted three electrically isolated detecting segments 174, 176 and 178, respectively. The inner detecting segment 174 has a circular shape and is provided with a deposited lead S'. The middle detecting segment 176, which has a "C" shape, is spaced from and positioned concentrically about the inner segment 174, and provided with a deposited lead M. The outer detecting segment 178, which also has a "C" shape, is spaced from and positioned concentrically about the middle segment 176, and provided with a deposited lead L'. A lead C' common to each of the segments 174, 176 and 178 is also provided.

By enabling only the inner detecting segment 174 to contribute to the detector output, the element 170 of FIG. 4 operates effectively as a detector with a circular active area of diameter equal to that of the inner segment 174. By enabling the middle detecting segment 176 to contribute to the detector output, either alone or in a summing fashion with the inner detecting segment 174, the element 170 operates effectively as a detector with a circular active area of diameter equal to that of the outer boundary of the middle segment 176. Finally, by enabling the outer detecting segment 178 to contribute to the detector output, either with the middle segment 176 or with both the middle and inner segments 176 and 174, respectively, the element 170 operates effectively as a detector with a circular active area of diameter equal to that of the outer boundary of the outer segment 178.

The pre-amplifier and detector area select circuit 90 shown in FIG. 3 can readily be modified to handle the three-level detector element 170 of FIG. 4. This may be accomplished by adding a third circuit branch, upstream of the summing amplifier 140, which is identical to the circuit branches for the leads L and S shown on the left-hand side of FIG. 3, and which accommodates the signal on the lead M from the middle area detector segment 176.

As should now be evident, detector elements with four or more concentric detecting segments could also be utilized if desired.

FIG. 5 illustrates still another modified detector element 270 which has an essentially square configuration, instead of the circular configuration of the embodiments of FIGS. 2 and 4. More specifically, the detector element 270 includes an inner detecting segment 274 which has an essentially square shape, and an outer detecting segment 276 which has a squared or block "C" shape and which is spaced from and positioned about the inner segment 274. As in the detector element 70 previously described, the segments 274 and 276 in the element 270 are formed on a major face 278 of an insulative substrate 272, and are provided with deposited electrical leads L", S" and C" which are extended out of the dewar 82 (FIG. 1) for external connection in the circuit 90 of FIG. 1.

Other detecting segment shapes and geometries may also be employed, as desired for each particular spectrometer application.

The detector elements 70, 170 and 270 may be fabricated using standard optical masking, etching, polishing, lead deposition and related techniques of the type employed conventionally in the fabrication of MCT detectors. These techniques are well-developed, and permit the fabrication of high quality MCT detectors in any of a variety of geometries and configurations. Those desiring further information on such fabrication techniques are referred to the multi-volume series titled *Semi-Conductors and Semi-Metals*, edited by Willardson and Beer and published by Academic Press, including particularly Volume V (1970), Chapter 5, pages 175 through 255, and Volume XVIII (1981) thereof.

It should be understood that the embodiments of the invention described specifically above are intended merely to illustrate the basic principles of the invention. Thus, they should be interpreted as examples, and not in a limiting sense. Numerous modifications to the described embodiments, in addition to those already mentioned above, will in fact be recognized by those skilled in the art which do not depart from the intended scope of the invention, as defined by the appended claims.

For example, it will be appreciated that the outer detecting segments 76 and 276, respectively, in the embodiments of FIGS. 2 and 5, and the middle and outer detecting segments 176 and 178, respectively, in the embodiment of FIG. 4, instead of having the illustrated "C" shape, could extend completely around their respective inner detecting segments 74, 174 or 274. In such a case, the electrical leads, instead of being deposited directly on their respective substrates 72, 172 or 272, could extend upwardly out of the plane of such substrates prior to being fed out of the dewar 82. The detecting segments in each of the elements 70, 170 and 270 can also be fabricated from any of a variety of well known infrared sensitive materials other than MCT. Moreover, it will be appreciated that the principles of the invention may be applied to a variety of spectrometric instruments, other than Fourier transform interferometer-spectrometers of the type specifically shown and described above, which require high detector sensitivity with a selectable detector active area. It is thus the intent of the appended claims to cover these and other modifications as come within the true scope of the invention.

We claim:

1. Apparatus for analyzing a sample by interacting a beam of radiant energy with the sample, said apparatus including means for detecting the beam of radiant energy after interaction with the sample and for producing an electrical output corresponding thereto, said detecting means comprising:
   A. a first detecting segment for producing an electrical signal in response to radiant energy incident thereon;
   B. a second detecting segment for producing an electrical signal in response to radiant energy incident thereon, said second detecting segment extending at least partially around said first detecting segment and being electrically isolated from said first detecting segment; and
   C. output selection means operable in a first mode for enabling the electrical signal only from said first detecting segment to contribute to the output of said detecting means, and in a second mode for enabling the electrical signal from at least said second detecting segment to contribute to the output of said detecting means.

2. The apparatus of claim 1 in which said second detecting segment has a substantially annular shape with inner and outer boundaries, and in which said first detecting segment is spaced from and positioned within the inner boundary of said second detecting segment, the area within the outer boundary of said second detecting segment thereby being greater than the area defined by said first detecting segment.

3. The apparatus of claim 2 in which said second detecting segment has a substantially circular annular shape with a substantially circular inner boundary, and in which said first detecting segment has a substantially circular shape of diameter slightly less than the diameter of the inner boundary of said second detecting segment.

4. The apparatus of claim 3 in which the outer boundary of said second detecting segment has a diameter of about three millimeters and in which said first detecting segment has a diameter of about one millimeter.

5. The apparatus of claim 2 in which said second detecting segment has a substantially square annular shape with a substantially square inner boundary, and in which said first detecting segment has a substantially square shape of height and width slightly less than the height and width of the inner boundary of said second detecting segment.

6. The apparatus of claim 2 in which each of said first and second detecting segments has at least one lead electrically connected thereto and extending therefrom for carrying the electrical signals produced thereby, and in which said second detecting segment extends only partially around said first detecting segment, thereby defining an opening of sufficient size to receive said lead extending from said first detecting segment.

7. The apparatus of claim 1 in which said output selection means includes means operable in said second mode for selecting the electrical signal only from said second detecting segment as the output of said detecting means.

8. The apparatus of claim 1 in which said output selection means includes means operable in said second mode for summing the electrical signals from both said first and said second detecting segments as the output of said detecting means.

9. The apparatus of claim 8 in which said output selection means further includes means for independently amplifying the respective electrical signals from said first and second detecting segments, whereby the gain of the respective electrical signals may be balanced relative to one another.

10. The apparatus of claim 1 in which said output selection means comprises switch means for receiving the electrical signals from said first and second detecting segments, said switch means in said first mode passing the electrical signal only from said first detecting segment, and in said second mode passing the electrical signal from at least said second detecting segment.

11. The apparatus of claim 1 in which said output selection means comprises means for supplying bias current to each of said first and second detecting segments, said segments being rendered responsive to the radiant energy when bias current is supplied thereto, said bias current supplying means in said first mode supplying bias current only to said first detecting segment and in said second mode supplying bias current to at least said second detecting segment.

12. The apparatus of claim 1 in which said detecting means further includes a third detecting segment for producing an electrical signal in response to radiant energy incident thereon, said third detecting segment being electrically isolated from said first and second detecting segments and extending at least partially around said second detecting segment, and in which said output selection means is further operable in a third mode for enabling the electrical signal from at least the third detecting segment to contribute to the output of said detecting means.

13. The apparatus of claim 1 further including a source of said beam of radiant energy, said radiant energy being in the infrared region of the electromagnetic spectrum.

14. Tne apparatus of claim 13 in which said first and second detecting segments are fabricated from mercury cadmium telluride.

15. The apparatus of claim 14 in which said detecting means further includes means for cooling said first and second segments to a cryogenic temperature.

16. Apparatus for analyzing a sample by interacting a beam of infrared radiation with the sample, said apparatus comprising:
   A. a source for producing a beam of infrared radiation;

B. means for varying the intensity of said beam of infrared radiation;

C. means for directing said beam of infrared radiation for interaction with the sample;

D. means for detecting the beam of infrared radiation after interaction with the sample and for producing an electrical output corresponding thereto, said detecting means comprising:
  i. a first detecting segment for producing an electrical signal in response to infrared radiation incident thereon; and
  ii. a second detecting segment for producing an electrical signal in response to infrared radiation incident thereon, said second detecting segment extending at least partially around said first detecting segment and being electrically isolated from said first detecting segment; and E. output selection means operable in a first mode for enabling the electrical signal only from said first detecting segment to contribute to the output of said detecting means, and in a second mode for enabling the electrical signal from at least said second detecting segment to contribute to the output of said detecting means.

17. The apparatus of claim 16 in which said intensity varying means comprises an interferometer.

18. The apparatus of claim 16 further including:
F. means for performing Fourier transform analysis on the output of said detecting means.

19. The apparatus of claim 16 further including:
G. means for varying the beam size of said beam of infrared radiation emitted by said source.

20. The apparatus of claim 16 in which said intensity varying means includes means for controlling the rate of change of the intensity of said beam of infrared radiation.

* * * * *